US012690289B2

(12) United States Patent
Li et al.

(10) Patent No.: US 12,690,289 B2
(45) Date of Patent: Jul. 21, 2026

(54) SOLAR CELL AND PHOTOVOLTAIC MODULE

(71) Applicants:ZHEJIANG JINKO SOLAR CO., LTD., Haining (CN); JINKO SOLAR CO., LTD., Jiangxi (CN)

(72) Inventors: Huimin Li, Haining (CN); Menglei Xu, Haining (CN); Jie Yang, Haining (CN); Xinyu Zhang, Haining (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/600,460

(22) Filed: Mar. 8, 2024

(65) Prior Publication Data

US 2025/0221085 A1 Jul. 3, 2025

(30) Foreign Application Priority Data

Dec. 28, 2023 (CN) .......................... 202311846847.7

(51) Int. Cl.
*H10F 77/12* (2025.01)
*H10F 10/10* (2025.01)
(52) U.S. Cl.
CPC ............. *H10F 77/12* (2025.01); *H10F 10/10* (2025.01)
(58) Field of Classification Search
CPC .................................. H10F 77/12; H10F 10/10
See application file for complete search history.

(56) References Cited

U.S. PATENT DOCUMENTS

| | | |
|---|---|---|
| 2013/0048070 A1 | 2/2013 | Hazeghi et al. |
| 2013/0298973 A1 | 11/2013 | Xie et al. |
| 2015/0179834 A1 | 6/2015 | Agrawal et al. |
| 2015/0380599 A1 | 12/2015 | Smith et al. |

(Continued)

FOREIGN PATENT DOCUMENTS

| | | | |
|---|---|---|---|
| CN | 210200743 U | 3/2020 | |
| CN | 111133589 A * | 5/2020 | ......... H10F 71/1221 |

(Continued)

OTHER PUBLICATIONS

Zhejiang Jinko Solar Co., Ltd., et al., Extended European Search Report, EP 24162248.9, Aug. 28, 2024, 30 pgs.

(Continued)

*Primary Examiner* — Uyen M Tran
(74) *Attorney, Agent, or Firm* — USCH Law, PC

(57) ABSTRACT
Embodiments of the present disclosure relate to a solar cell and a photovoltaic module. The solar cell includes: a substrate, a tunneling layer formed on a rear surface of the substrate, and a doped conductive layer formed on the tunneling layer. The tunneling layer includes first regions and second regions, the first regions interleave with the second regions in a first direction, and the first regions include first dopant atoms. The doped conductive layer includes first doped regions formed on the first regions and second doped regions formed on the second regions. The first doped regions and the second doped regions have different doping types, the first doped regions include the first dopant atoms, and an atomic percentage of the first dopant atoms in the first doped regions is lower than an atomic percentage of the first dopant atoms in the first regions.

20 Claims, 6 Drawing Sheets

(56)     References Cited

U.S. PATENT DOCUMENTS

| | | | |
|---|---|---|---|
| 2017/0069778 A1 * | 3/2017 | Kwon | ................... H10F 19/906 |
| 2018/0122963 A1 * | 5/2018 | Xu | ......................... H10F 10/166 |
| 2020/0287065 A1 | 9/2020 | Tno | |
| 2023/0253520 A1 | 8/2023 | Yang et al. | |
| 2024/0347656 A1 * | 10/2024 | Li | ......................... H10F 10/166 |

FOREIGN PATENT DOCUMENTS

| | | | | | |
|---|---|---|---|---|---|
| CN | 115566088 | A | | 1/2023 | |
| CN | 115954414 | A | | 4/2023 | |
| CN | 116666497 | A | | 8/2023 | |
| CN | 116722049 | A | | 9/2023 | |
| CN | 116741871 | A | | 9/2023 | |
| CN | 116759468 | A | | 9/2023 | |
| DE | 202022106692 | U1 | * | 12/2022 | ............. H10F 77/14 |
| JP | 2015060884 | A | | 3/2015 | |
| JP | 2017511593 | A | | 4/2017 | |
| JP | 2018532273 | A | | 11/2018 | |
| JP | 2020096090 | A | | 6/2020 | |
| JP | 2023103391 | A | * | 7/2023 | ........... H10F 77/219 |
| WO | 2019021545 | A1 | | 1/2019 | |

OTHER PUBLICATIONS

Zhejiang Jinko Solar Co., Ltd. et al, European Communication pursuant to Article 94(3) EPC, EP24162248.9, Jan. 21, 2026, 6 pgs.
Zhejiang Jinko Solar Co., Ltd et al., JP Second Office Action with English translation, JP2025-183288, May 15, 2026, 9 pgs.

* cited by examiner 405
404
401
402
403
406

Y 1104
1103
1101
1102
1103

SOLAR CELL AND PHOTOVOLTAIC MODULE

CROSS REFERENCE TO RELATED APPLICATIONS

The present application claims the benefit of priority under the Paris Convention to Chinese Patent Application No. 202311846847.7 filed on Dec. 28, 2023, which is incorporated herein by reference in its entirety.

TECHNICAL FIELD

Embodiments of the present disclosure relate to the field of solar cell technology, and in particular to a solar cell and a photovoltaic module.

BACKGROUND

The fossil energy has the defects of air pollution and limited reserves, while the solar energy has the advantages of cleanliness, no pollution, abundant resources, and the like. Therefore, the solar energy is gradually becoming a core clean energy taking place of the fossil energy. Because solar cells have excellent photoelectric conversion efficiency, the solar cells are becoming the focus of development for clean energy utilization.

In order to increase the efficiency of the solar cells and the utilization rate of the incident light as much as possible, tunnel oxide passivated contact (TOPCon) cells and interdigitated back contact (IBC) crystalline silicon photovoltaic cells have emerged. A tunneling oxide layer and a doped conductive layer formed on the rear surface of a TOPCon cell can form a passivation contact structure, thereby significantly increasing the passivation effect and open-circuit voltage of the cell, and increasing the photoelectric conversion efficiency of the solar cell. Electrodes of an IBC cell are all formed on the rear surface of the cell, thereby preventing the light blocking caused by the electrodes formed on the front surface of the cell, significantly improving the light absorption of the cell, and increasing the photoelectric conversion efficiency of the cell.

SUMMARY

Embodiments of the present disclosure provide a solar cell and a photovoltaic module, which is at least conducive to increase of the open-circuit voltage and to improvement of the photoelectric conversion efficiency of the solar cells.

Some embodiments of the present disclosure provide a solar cell, including: a substrate having a front surface and a rear surface opposite to each other, a tunneling layer formed on the rear surface of the substrate, and a doped conductive layer formed on the tunneling layer. The tunneling layer includes first regions and second regions, the first regions interleave with the second regions in a first direction, and the first regions include first dopant atoms. The doped conductive layer includes first doped regions and second doped regions, each first doped region of the first doped regions is formed on a respective first region of the first regions, and each second doped region of the second doped regions is formed on a respective second region of the second regions. The first doped regions have a doping type different from a doping type of the second doped regions, the first doped regions include the first dopant atoms, and an atomic percentage of the first dopant atoms in the first doped regions is lower than an atomic percentage of the first dopant atoms in the first regions.

In some embodiments, a ratio of the atomic percentage of the first dopant atoms in the first regions to the atomic percentage of the first dopant atoms in the first doped regions ranges from 1 to 5.

In some embodiments, the atomic percentage of the first dopant atoms in the first regions ranges from 1% to 10%.

In some embodiments, the atomic percentage of the first dopant atoms in the first doped regions ranges from 0.2% to 5%.

In some embodiments, the first dopant atoms are N-type atoms.

In some embodiments, in a direction perpendicular to the rear surface of the substrate and away from the substrate, the atomic percentage of the first dopant atoms in the first doped regions reduces in gradient.

In some embodiments, one respective first region of the first regions includes a first portion contacting with the substrate, and an atomic percentage of the first dopant atoms in the first portion is higher than the atomic percentage of the first dopant atoms in the respective first region.

In some embodiments, the atomic percentage of the first dopant atoms in the first portion ranges from 2% to 20%.

In some embodiments, in a direction perpendicular to the rear surface of the substrate, a ratio of a thickness of the first portion to a thickness of the respective first region ranges from 0.25 to 0.5.

In some embodiments, in the direction perpendicular to the rear surface of the substrate, the thickness of the first portion ranges from 0.25 nm to 1 nm.

In some embodiments, one respective first region of the first regions includes a second portion contacting with a corresponding first doped region, and an atomic percentage of the first dopant atoms in the second portion is higher than the atomic percentage of the first dopant atoms in the respective first region.

In some embodiments, the atomic percentage of the first dopant atoms in the second portion ranges from 2% to 20%.

In some embodiments, in a direction perpendicular to the rear surface of the substrate, a ratio of a thickness of the second portion to a thickness of the respective first portion ranges from 0.25 to 0.5.

In some embodiments, in the direction perpendicular to the rear surface of the substrate, the thickness of the second portion ranges from 0.25 nm to 1 nm.

Some embodiments of the present disclosure provide a photovoltaic module, including: at least one cell string formed by connecting a plurality of solar cells as illustrated above, at least one encapsulation layer configured to cover a surface of the at least one cell string, and at least one cover plate configured to cover a surface of the at least one encapsulation layer away from the at least one cell string.

BRIEF DESCRIPTION OF THE DRAWINGS

One or more embodiments are exemplarily described with reference to the corresponding figures in the accompanying drawings, and the exemplary descriptions do not constitute limitations to the embodiments. Unless otherwise specified, the figures in the accompanying drawings are not drawn to scale.

DETAILED DESCRIPTION OF THE EMBODIMENTS

Figure 1:
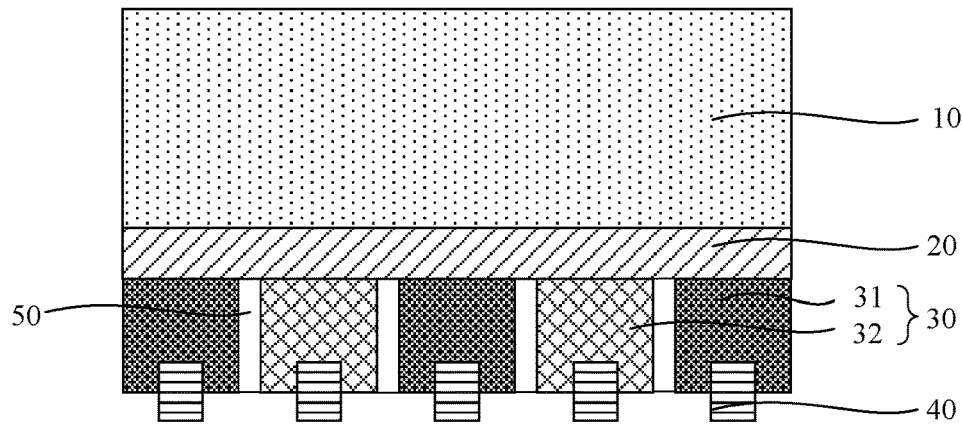
FIG. 1 is a schematic diagram of an overall structure of a solar cell provided in some embodiments of the present disclosure.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

In the drawings, the thickness of layers and an area has been enlarged for better understanding and ease of description. When it is described that a part, such as a layer, film, area, or substrate, is "over" or "on" another part, the part may be "directly" on another part or a third part may be present between the two parts. In contrast, when it is described that a part is "directly on" another part, it means that a third part is not present between the two parts. Furthermore, when it is described that a part is "generally" formed on another part, it means the part is not formed on the entire surface (or front surface) of another part and is also not formed in part of the edge of the entire surface.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise.

In some embodiments, referring to FIG. 1, an IBC cell usually includes a substrate 10, a tunneling dielectric layer 20, a doped conductive layer 30 and a plurality of electrodes 40. The substrate 10 has a front surface and a rear surface opposite to each other, the tunneling dielectric layer 20 is formed on the rear surface of the substrate 10, and the doped conductive layer 30 is formed on the tunneling dielectric layer 20. The doped conductive layer 30 includes first doped regions 31 and second doped regions 32, and the first doped regions 31 have a doping type different from a doping type of the second doped regions 32. Some electrodes 40 of the plurality of electrodes 40 are in electrical contact with the first doped regions 31, and the remaining electrodes 40 are in electrical contact with the second doped regions 32. The electrodes in electrical contact with the first doped regions are insulated from the electrodes in electrical contact with the second doped regions.

In the process of forming an IBC cell, because the electrodes 40 are formed on the rear surface of the substrate 10, the front surface of the formed IBC cell does not have the electrodes 40, thereby preventing the light blocking caused by the electrodes 40 formed on the front surface of the IBC cell, and significantly increasing the light reception area of the front surface of the IBC cell. The rear surface of the substrate 10 has a passivation contact structure formed by the tunneling dielectric layer 20 and the doped conductive layer 30, thus the carrier recombination loss on the rear surface of the substrate 10 is significantly reduced. In addition, the IBC cell has a higher light utilization rate, and the photoelectric conversion efficiency is significantly improved.

Moreover, the IBC cell may further include isolation layers 50 penetrating through the thickness of the doped conductive layer 30, and the isolation layers 50 are formed between the first doped regions 31 and the second doped regions 32 and configured to isolate the first doped regions 31 and the second doped regions 32 having different doping types from each other. The isolation layers 50 may be insulating dielectric layers formed by depositing an insulating dielectric, or may be a groove formed by patterned etching. FIG. 1 takes the isolation layers 50 only penetrating through the thickness of the doped conductive layer 30 as an example for description. In practice, the isolation layers 50 may further extend towards the interior of the tunneling dielectric layer 20 and even penetrate through the thickness of the tunneling dielectric layer 20, which is not specifically limited in the embodiments of the present disclosure.

Some of the accompanying drawings in the embodiments of the present disclosure only show partial structures of the IBC cell. The IBC cell may further include other layers, such as a passivation anti-reflection layer formed on the surface of the doped conductive layer away from the substrate and/or a passivation anti-reflection layer formed on the front surface of the substrate, which will not be described in detail herein.

Some embodiments of the present disclosure provide a solar cell, a passivation contact structure formed by a tunneling layer and a doped conductive layer is disposed on a rear surface of a substrate of the solar cell, which can significantly reduce recombination of carriers occurred on the rear surface of the substrate, thereby reducing the recombination current on the rear surface of the substrate, and reducing the carrier recombination loss of the solar cell. The doped conductive layer is formed by first doped regions and second doped regions having different doping types, in this way, electrodes of the solar cell can be disposed on the rear surface of the solar cell, thereby significantly reducing the influence on the light absorption of the cell caused by disposing electrodes on the front surface of the solar cell, and improving the light absorption of the solar cell. The tunneling layer is formed by first regions and second regions, the first regions interleave with the second regions in a first direction, each first doped region of the first doped regions is formed on a respective first region of the first regions, each first region and each first doped region include first dopant atoms, and the atomic percentage of the first dopant atoms in the first regions is higher than the atomic percentage of the first dopant atoms in the first doped regions. Because of the enrichment of the first dopant atoms in the tunneling layer, the open-circuit voltage of the solar cell can be increased, and by doping the first dopant atoms in the tunneling layer, the tunneling ability of carriers in the tunneling layer can be improved, thereby significantly improving the photoelectric conversion efficiency of the solar cell.

The embodiments of the present disclosure will be described in detail below with reference to the accompanying drawings. Those of ordinary skill in the art shall understand that in the embodiments of the present disclosure, many technical details are provided for readers to better understand the present disclosure, however, even without these technical details and various changes and modifications based on the following embodiments, the technical solutions set forth in the present disclosure can also be realized.

Figure 2:
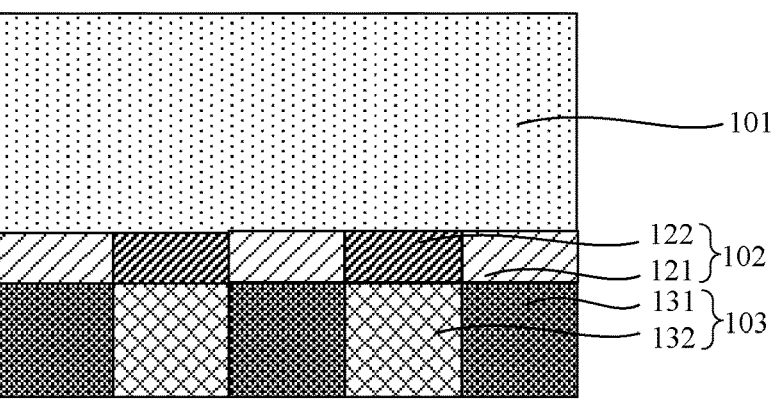
FIG. 2 is a schematic diagram of an overall structure of another solar cell provided in some embodiments of the present disclosure.
Figure 3:
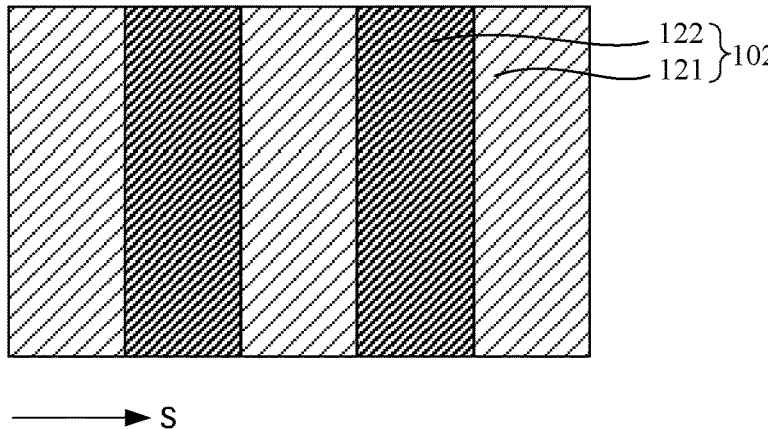
FIG. 3 is a top view of a tunneling layer provided in some embodiments of the present disclosure.

Some embodiments of the present disclosure provide a solar cell. Referring to FIG. 2 and FIG. 3, FIG. 2 is a schematic diagram of an overall structure of a solar cell, and FIG. 3 is a top view of a tunneling layer, where a direction X represents the first direction.

The solar cell includes: a substrate 101 having a front surface and a rear surface opposite to each other, a tunneling layer 102 formed on the rear surface of the substrate 101, and a doped conductive layer 103 formed on the tunneling layer 102. The tunneling layer 102 includes first regions 121 and second regions 122, the first regions 121 interleave with the second regions 122 in the first direction, and the first regions 121 includes first dopant atoms. The doped conductive layer 103 includes first doped regions 131 and second doped regions 132, each first doped region of the first doped regions 131 is formed on a respective first region of the first regions 121, and each second doped region of the second doped regions 132 is formed on a respective second region of the second regions 122. The first doped regions 131 have a doping type different from a doping type of the second doped regions 132. The first doped regions 131 include the first dopant atoms, and the atomic percentage of the first dopant atoms in the first doped regions 131 is lower than the atomic percentage of the first dopant atoms in the first regions 121.

In the solar cell, a passivation contact structure formed by the tunneling layer 102 and the doped conductive layer 103 is disposed on the rear surface of the substrate 101, the tunneling layer 102 passivates the defects on the surface of the substrate 101 by bonding, and the doped conductive layer 103 applies field passivation to the substrate 101 using a formed electric field, thereby significantly reducing the recombination of carriers occurred on the rear surface of the substrate 101, and reducing the carrier recombination loss of the solar cell. The doped conductive layer 103 is formed by first doped regions 131 and second doped regions 132 having different doping types, in this way, electrodes of the solar cell can be disposed on the rear surface of the solar cell, thereby preventing the light shielding effect caused by disposing electrodes on the front surface of the solar cell, and improving the light absorption of the solar cell. The front surface of the solar cell refers to a surface of the solar cell where the received incident light has relatively high intensity, and the rear surface of the solar cell refers to a surface of the solar cell where the received incident light has relatively low intensity.

The tunneling layer 102 is formed by first regions 121 and second regions 122, the first regions 121 interleave with the second regions 122 in the first direction, each first doped region of the first doped regions 131 is formed on a respective first region of the first regions 121, the first regions 121 and the first doped regions 131 have a same doping type, and the atomic percentage of the first dopant atoms in the first regions 121 is higher than the atomic percentage of the first dopant atoms in the first doped regions 131. Because of the enrichment of the first dopant atoms in the first regions 121 of the tunneling layer 102, the passivation contact structure can provide better passivation effect to the substrate 101, and the open-circuit voltage of the solar cell can be increased. Moreover, by doping the first dopant atoms in the first regions 121, the tunneling ability of carriers in the first regions 121 can be improved, thereby significantly reducing the carrier aggregation loss of the solar cell, and improving the photoelectric conversion efficiency of the solar cell.

Figure 4:
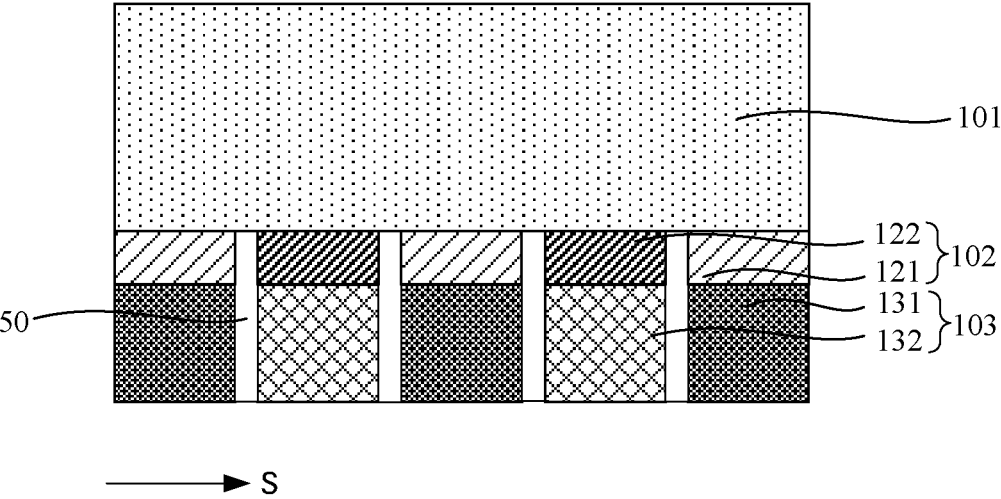
FIG. 4 is a schematic diagram of an overall structure of still another solar cell provided in some embodiments of the present disclosure.

In FIG. 2, the first doped regions 131 and the second doped regions 132 adjacent to each other are taken as an example for description. Referring to FIG. 2 and FIG. 4, FIG. 4 is a schematic diagram of an overall structure of a solar cell, where a direction X represents the first direction. The solar cell may further include a plurality of isolation layers 50 penetrating through the thickness of a stacked structure formed by the tunneling layer 102 and the doped conductive layer 103. The plurality of isolation layers 50 are configured to isolate the first regions 121 from the second regions 122, and isolate the first doped regions 131 from the second doped regions 132. The plurality of isolation layers 50 may be grooves penetrating through the thickness of the stacked structure, or a plurality of dielectric layers formed by a non-conductive insulating dielectric material. In FIG. 4, the plurality of isolation layers 50 penetrating through the tunneling layer 102 and the doped conductive layer 103 are taken as an example for description. The plurality of isolation layers 50 may only penetrate through the thickness of the doped conductive layer 103, or penetrate through the thickness of the doped conductive layer 103 and extend towards the interior of the tunneling layer 102 by a certain distance, which are not specifically limited in the embodiments of the present disclosure.

In some embodiments, the substrate 101 may be a P-type semiconductor substrate or an N-type semiconductor substrate. The doping type of one of one respective first doped region 131 and one respective second doped region 132 is P-type, the doping type of the other of the respective first doped region 131 and the respective second doped region 132 is N-type, and the doped regions of the doped conductive layer 103 of a same doping type as the substrate 101 have doping concentration higher than the doping concentration of the substrate 101. The doping concentration may be represented by the atomic percentage of doped elements in a layer.

An N-type doped element is doped in the N-type semiconductor substrate, and the N-type doped element may be any of V-group elements such as phosphorus (P) element, bismuth (Bi) element, antimony (Sb) element or arsenic (As) element. A P-type doped element is doped in the P-type semiconductor substrate, and the P-type doped element may be any of III-group elements such as boron (B) element, aluminum (Al) element, gallium (Ga) element or indium (In) element. Similarly, the P-type doped element in the doped conductive layer 103 may be any of the III-group elements as mentioned above, and the N-type doped element may be any of the V-group elements as mentioned above.

In some embodiments, the material of the substrate 101 may be an elemental semiconductor material composed of a single element, such as silicon or germanium. The elemental semiconductor material may be in a monocrystalline state, a polycrystalline state, an amorphous state or a microcrystalline state (referred to a state in which a monocrystalline state and an amorphous state present concurrently). For example, silicon may be at least one of monocrystalline silicon, polycrystalline silicon, amorphous silicon or microcrystalline silicon.

In some embodiments, the material of the substrate 101 may also be a compound semiconductor material. Common compound semiconductor materials include, but are not limited to, silicon germanide, silicon carbide, gallium arsenide, indium gallide, perovskite, cadmium telluride, copper indium diselenide, and the like. The substrate 101 may also be a sapphire substrate, a silicon substrate on an insulator, or a germanium substrate on an insulator.

In some embodiments, the material of the tunneling layer 102 may be at least one of silicon oxide, silicon nitride, silicon oxynitride, silicon carbide or magnesium fluoride.

In some embodiments, the material of the doped conductive layer 103 may be at least one of nanocrystalline silicon, polycrystalline silicon, microcrystalline silicon, amorphous silicon, silicon carbide or titanium nitride.

In some embodiments, a ratio of the atomic percentage of the first dopant atoms in the first regions 121 to the atomic percentage of the first dopant atoms in the first doped regions 131 ranges from 1 to 5.

For ease of understanding, an N-type substrate 101, first regions 121 and first doped regions 131 of N doping type, and a doped element being phosphorus are taken as an example. The tunneling layer 102 and the doped conductive layer 103 have a main function of providing good passivation to the substrate 101, thereby reducing the carrier recombination occurred on the rear surface of the substrate 101, and increasing the open-circuit voltage and improving the photoelectric conversion efficiency of the solar cell.

When the atomic percentage of phosphorus in the first regions 121 is significantly higher than the atomic percentage of phosphorus in the first doped regions 131, the enrichment of phosphorus in the first regions 121 of the tunneling layer 102 is achieved, and the passivation contact structure on the rear surface of the substrate 101 can provide a better passivation effect to the substrate 101, thereby further increasing the open-circuit voltage of the solar cell, and reducing the carrier recombination occurred on the rear surface of the substrate 101.

In addition, the tunneling layer 102 has another function of achieving selective transfer of carriers. When the doped conductive layer 103 is composed of the first doped regions 131 and the second doped regions 132 of different doping types, the portions of the tunneling layer 102 which are directly opposite to the first doped regions 131 and the second doped regions 132, respectively, need to achieve selective transfer of holes and electrons, respectively. The doped elements in the first regions 121 and the first doped region 131 are both phosphorus, and the first regions 121 needs to achieve selective transfer of holes to the first doped regions 131. Due to the enrichment of a large amount of phosphorus in the first regions 121, the tunneling ability of the holes in the first regions 121 can be improved, and the electrons escaped from the first regions 121 will recombine with the holes. Moreover, the recombination of the electrons and the holes increases with the doping concentration of phosphorus element in the first regions 121.

Therefore, in the process of forming the tunneling layer 102 and the doped conductive layer 103, the ratio of the atomic percentage of the first dopant atoms in the first regions 121 to the atomic percentage of the first dopant atoms in the first doped regions 131 may be set within a range of 1 to 5, such as 1.1, 1.2, 1.35, 1.5, 1.75, 2, 2.4, 2.8, 3.25, 3.75, 4.5, 4.85, or the like. By setting the ratio of the doping concentration of the first regions 121 to the doping concentration of the first doped regions 131 within an appropriate range, the open-circuit voltage of the solar cell can be effectively increased, and the carrier aggregation loss occurred on the rear surface of the substrate 101 can be reduced. Furthermore, the recombination effect of the holes and electrons in the first regions 121 is controlled within a relatively small range, so that the influence on the photoelectric conversion efficiency of the solar cell caused by the improvement of passivation effect of the solar cell and of tunneling ability of carriers is higher than the influence on the photoelectric conversion efficiency of the solar cell caused by the recombination of carriers occurred in the first regions 121, thereby effectively improving the photoelectric conversion efficiency of the solar cell.

In some embodiments, the atomic percentage of the first dopant atoms in the first doped regions 131 ranges from 0.2% to 5%.

Referring to the above analysis and description on the doped conductive layer 103 and the tunneling layer 102, on the one hand, the first doped regions 131 are configured to cooperate with the first regions 121 to apply passivation to the substrate 101, and on the other hand, the first doped regions 131 are also configured to achieve transversal transfer of carriers, so that the carriers in the first doped regions 131 can be aggregated to the electrodes in electrical contact with the first doped regions 131.

When the atomic percentage of the first dopant atoms in the first doped regions 131 is too low, that is, when the doping concentration of the first doped regions 131 is too low, the number of movable carriers in the first doped regions 131 is too few, the carriers transferred to the first doped regions 131 cannot be efficiently aggregated on the electrodes in electrical contact with the first doped regions 131, and thus, the carrier aggregation loss of the solar cell is too high. When the atomic percentage of the first dopant atoms in the first doped regions 131 is too high, that is, when the doping concentration of the first doped regions 131 is too high, the atomic percentage of the first dopant atoms in the first regions 121 is higher, and the carrier recombination loss caused by the recombination effect of electrons and holes in the first regions 121 is significantly increased, so that the influence caused by the increase in carrier recombination loss in the first regions 121 is higher than the influence caused by the decrease in carrier recombination loss occurred on the rear surface of the substrate 101.

Therefore, the atomic percentage of the first dopant atoms in the first doped regions 131 may be set within a range of 0.2% to 5%, such as 0.25%, 0.5%, 0.8%, 1.2%, 1.5%, 1.8%, 2.25%, 2.75%, 3.5%, 4.5%, or the like. In this way, carriers in the first doped regions 131 can be ensured to have a good transversal transfer ability to reduce the carrier aggregation loss of the solar cell. Moreover, the carrier recombination effect in the first regions 121 can be effectively controlled to ensure that the overall carrier recombination loss of the solar cell is decreased, thereby effectively improving the photo-electric conversion efficiency of the solar cell.

In some embodiments, in a direction perpendicular to the rear surface of the substrate 101 and away from the substrate 101, the atomic percentage of the first dopant atoms in the first doped regions 131 reduces in gradient.

In the process of forming the doped conductive layer 103, at least one of various doping processes, such as ion implantation or in-situ doping, may be used for doping the first dopant atoms in the first doped regions 131 of the doped conductive layer 103. By adjusting the deposition process for the doped conductive layer 103 and/or the doping process for the first doped regions 131, distribution of the first dopant atoms in the first doped regions 131 can be adjusted.

Referring to the above analysis on the first doped regions 131, the atomic percentage of the first dopant atoms in the first doped regions 131 mainly determines the passivation effect provided by the passivation contact structure to the substrate 101, as well as the carrier aggregation loss of carriers aggregated through the first doped regions 131 and on electrodes. In the process of carriers in the first doped regions 131 aggregating on electrodes, the distances of transversal movement of the carriers in the first doped regions 131 decrease with the distances between the carriers and the electrodes.

Therefore, in the direction perpendicular to the rear surface of the substrate 101 and away from the substrate 101, the atomic percentage of the first dopant atoms in the first doped regions 131 may be set to reduce in gradient. When the atomic percentage of the first dopant atoms in the first doped regions 131 is constant, the atomic percentage reducing in gradient can ensure the carrier aggregation efficiency in the first doped regions 131 and can improve field passivation for the substrate 101, thereby further reducing the carrier recombination occurred on the rear surface of the substrate 101.

In addition to setting the atomic percentage of the first dopant atoms in the first doped regions 131 to change in gradient, in the direction perpendicular to the rear surface of the substrate 101 and away from the substrate 101, the atomic percentage of the first dopant atoms in the first regions 121 also may be set to reduce in gradient, thereby reducing the recombination of electrons and holes in the first regions 121.

In some embodiments, the atomic percentage of the first dopant atoms in the first regions 121 ranges from 1% to 10%.

Referring to the above analysis and description on the atomic percentage of the first dopant atoms in the first regions 121, when the atomic percentage of the first dopant atoms in the first regions 121 is too low, the passivation contact structure on the rear surface of the substrate 101 provides limited improvement on the passivation effect to the rear surface of the substrate 101, and the decrease in carrier recombination loss occurred on the rear surface of the substrate 101 is relatively small. When the atomic percentage of the first dopant atoms in the first regions 121 is too high, during transfer of carriers from the first regions 121 to the first doped regions 131, the recombination effect of the holes and electrons in the first regions 121 is too great, and the carrier recombination loss in the first regions 121 is significantly increased, which is prone to lead to an increase in the overall carrier recombination loss of the solar cell.

Therefore, in the process of forming the tunneling layer 102, the atomic percentage of the first dopant atoms in the first regions 121 may be set within a range of 1% to 10%, such as 1.25%, 1.5%, 2%, 2.5%, 3.5%, 5%, 6.5%, 8%, 9.5%, or the like. By setting the atomic percentage of the first dopant atoms in the first regions 121 within an appropriate range, the tunneling ability of carriers in the first regions 121 can be improved, and the carrier recombination loss occurred on the rear surface of the substrate 101 can be reduced. Moreover, excessive carrier recombination loss in the first regions 121 can be prevented, thereby reducing the overall carrier recombination loss of the solar cell, increasing the open-circuit voltage and improving the photoelectric conversion efficiency of the solar cell.

Figure 5:
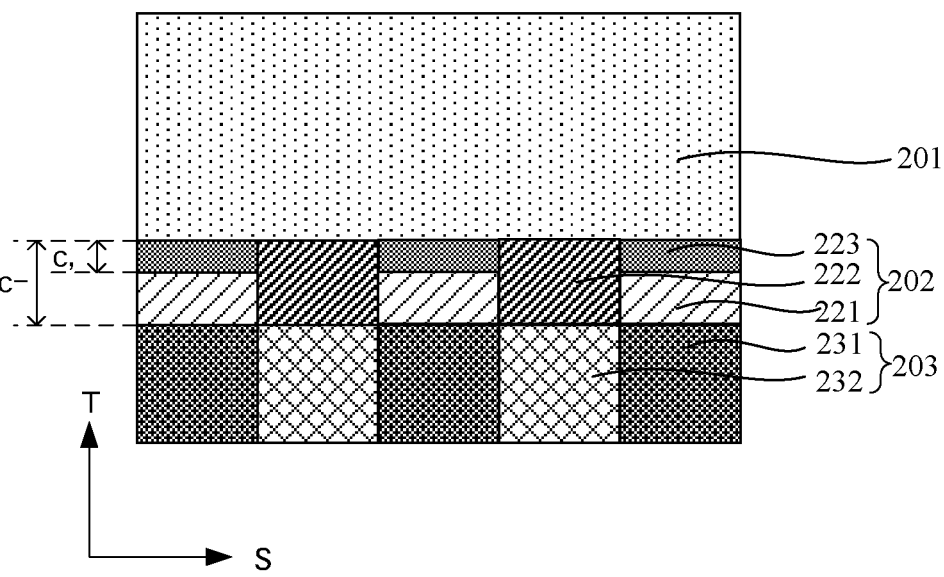
FIG. 5 is a schematic diagram of an overall structure of yet another solar cell provided in some embodiments of the present disclosure.

Referring to FIG. 2 and FIG. 5, FIG. 5 is a schematic diagram of an overall structure of another solar cell, where a direction X represents the first direction, and a direction Y represents a direction perpendicular to a rear surface of a substrate 201. In some embodiments, one respective first region of first regions 221 includes a first portion 223 contacting with the substrate 201, and the atomic percentage of the first dopant atoms in the first portion 223 is higher than the atomic percentage of the first dopant atoms in the respective first region 221.

In the solar cell as shown in FIG. 5, the substrate 201, a doped conductive layer 203, first doped regions 231, second doped regions 232 and second regions 222 of a tunneling layer 202 are similar to the substrate 101, the doped conductive layer 103, the first doped regions 131, the second doped regions 132 and the second regions 122 of the tunneling layer 102 as mentioned above, respectively, which will not be described in detail herein.

Referring to the above description and analysis on the first regions 121, one function of the first regions 221 is to provide a passivation effect to the substrate 201, and another function is to achieve selective transfer of a type of specific carriers to the first doped regions 231 directly opposite to the first regions 221.

Therefore, in the process of forming the first regions 221, the first regions 221 may be formed to have heavily doped portions, and the heavily doped portions face towards the substrate 201, that is, the first regions 221 include first portions 223 contacting with the rear surface of the substrate 201, and the atomic percentage of the first dopant atoms in the first portions 223 is higher than the atomic percentage of the first dopant atoms in the first regions 221. The atomic percentage of the first dopant atoms in the first regions 221 refers to the average atomic percentage of the first dopant atoms in the first regions 221 including the first portions 223. That is to say, the first regions 221 may be regarded as being formed by the first portions 223 and other portions except for the first portions 223, and doping concentration of the doped element in the first portions 223 is higher than doping concentration of the doped element in the other portions except for the first portions 223 of the first regions 221.

The first regions 221 can provide a passivation effect to the substrate 201 mainly because of the fact that an electric field can be formed between a film layer having doping concentration higher than that of the substrate 201 and the substrate 201, and the movement trend of carriers of different polarities can be adjusted by the electric field, so that on the rear surface of the substrate 201 facing towards the first regions 221, the number of carriers of one polarity is much larger than the number of carriers of the other polarity. Therefore, after forming the first portions 223, the electric field for adjusting the movement trend of carriers of different polarities is stronger, thereby further improving the passivation effect provided by the first regions 221 and the first doped regions 231 to the substrate 201, reducing the carrier loss occurred on the rear surface of the substrate 201, and increasing the open-circuit voltage of the solar cell.

Figure 6:
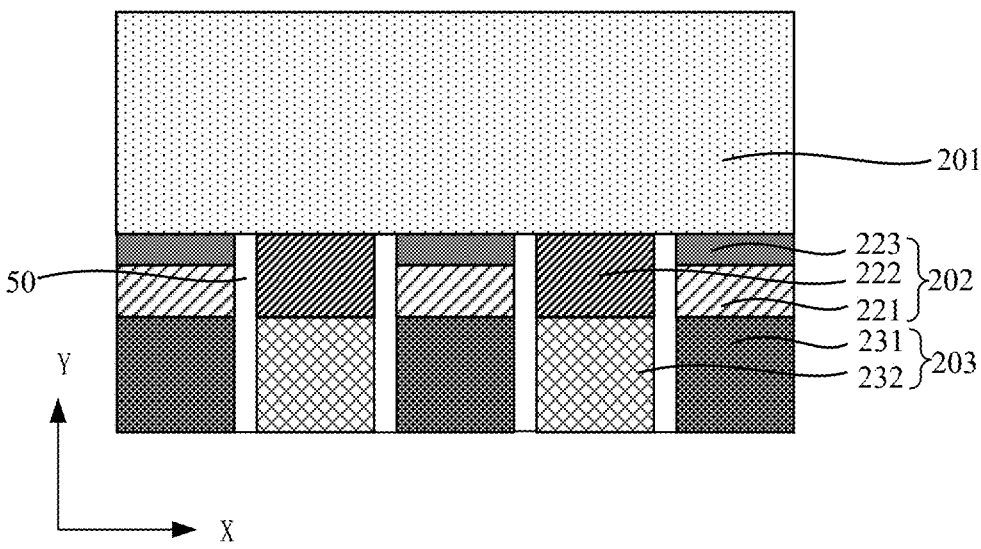
FIG. 6 is a schematic diagram of an overall structure of one more solar cell provided in some embodiments of the present disclosure.

In addition, referring to FIG. 5 and FIG. 6, FIG. 6 is a schematic diagram of an overall structure of a solar cell. The solar cell may further include a plurality of isolation layers 50. In FIG. 6, the plurality of isolation layers 50 are similar to the plurality of isolation layers 50 as mentioned above, and specific materials and specification parameters will not be described in detail herein. The plurality of isolation layers 50 can prevent the recombination of holes and electrons from occurring between the first doped regions 231 and the second doped regions 232, thereby prolonging the lifetime of carriers.

In some embodiments, the atomic percentage of the first dopant atoms in the first portions 223 ranges from 2% to 20%.

When the first regions 221 include the first portions 223, the atomic percentage of the first dopant atoms in the first portions 223 will influence the electric field intensity. When the atomic percentage of the first dopant atoms in the first portions 223 is lower, the formed first portions 223 do not significantly improve the field passivation effect and cannot effectively reduce the carrier recombination occurred on the rear surface of the substrate 201. When the atomic percentage of the first dopant atoms in the first portions 223 is too high, during transfer of carriers to the first doped regions 231, the recombination of electrons and holes in the first portions 223 is too strong, which is prone to lead to a significant increase in overall carrier recombination loss in the first regions 221, and even lead to a significant increase in overall carrier recombination loss of the solar cell.

Therefore, in the process of forming the tunneling layer 202, the atomic percentage of the first dopant atoms in the first portions 223 may be set within a range of 2% to 20%, such as 2.5%, 3%, 4%, 5%, 7.5%, 10%, 13%, 16%, 19%, or the like. By setting the doping concentration of the doped element in the first portions 223 within an appropriate range, the passivation effect provided by the passivation contact structure to the substrate 201 and the tunneling ability of carriers in the first regions 221 can be significantly enhanced, and the overall carrier recombination loss in the first regions 221 can be effectively controlled. In this way, the carrier recombination loss of the solar cell can be significantly reduced, and the photoelectric conversion efficiency of the solar cell can be improved.

In addition, the tunneling layer 202 includes a plurality of first regions 221, and the atomic percentages of the first dopant atoms in the first portions 223 of the plurality of first regions 221 may be the same or different from each other, which is not specifically limited in the embodiments of the present disclosure.

In some embodiments, in a direction perpendicular to the rear surface of the substrate 201, a ratio of the thickness of a first portion 223 to the thickness of a corresponding first region 221 ranges from 0.25 to 0.5.

In the direction perpendicular to the rear surface of the substrate 201, the thickness of one respective first portion 223 refers to an average distance h1 between two surfaces of the respective first portion 223 opposite to each other in the direction perpendicular to the rear surface of the substrate 201, and the thickness of one respective first region 221 refers to an average distance h2 between two surfaces of the respective first region 221 opposite to each other in the direction perpendicular to the rear surface of the substrate 201.

Referring to the above description and analysis on the first portions 223, on the one hand, the first portions 223 are conducive to enhancing the passivation effect provided by the passivation contact structure to the substrate 201, and on the other hand, the recombination effect of electrons and holes in the first portions 223 is also significantly enhanced, which is prone to influence the overall carrier recombination loss of the first regions 221 and the solar cell.

The carrier recombination loss occurred in the first portions 223 is determined, on the one hand, by the atomic percentage of the first dopant atoms in the first portions 223, and on the other hand, by the movement distances of carriers during transfer of carriers through the first portions 223. When the atomic percentage of the first dopant atoms is fixed, the thicker the first portions 223 are, the larger the carrier recombination loss occurred in the first portions 223. In addition, when the atomic percentage of the first dopant atoms in the first regions 221 is fixed, the thicker the first portions 223 are, the lower the atomic percentage of the first dopant atoms in the first portions 223 per unit thickness, which is prone to lead to a relatively small improvement on the passivation effect provided by the passivation contact structure to the substrate 201.

Therefore, in the process of forming the tunneling layer 202, in the direction perpendicular to the rear surface of the substrate 201, a ratio of the thickness of a first portion 223 to the thickness of a corresponding first region 221 may be set within a range of 0.25 to 0.5, such as 0.275, 0.3, 0.325, 0.375, 0.425, 0.45, or the like. In this way, the first portions 223 can significantly enhance the passivation effect provided by the passivation contact structure to the substrate 201, and the carrier recombination loss occurred in the first regions 221 can be controlled within a relatively small range, thereby significantly reducing the overall carrier recombination loss of the solar cell.

In some embodiments, in the direction perpendicular to the rear surface of the substrate 201, the thickness of one respective first portion 223 ranges from 0.25 nm to 1 nm. Referring to the above description and analysis on the thickness of the first portion 223, in the passivation contact structure, the thickness of a tunneling oxide layer, namely the tunneling layer 202, is usually within a range of 1 nm to 2 nm. Thus, in the process of forming the tunneling layer 202, in the direction perpendicular to the rear surface of the substrate 201, the thickness of one respective first portion 223 may be set within a range of 0.25 nm to 1 nm, such as 0.3 nm, 0.35 nm, 0.5 nm, 0.7 nm, 0.9 nm, or the like.

Figure 7:
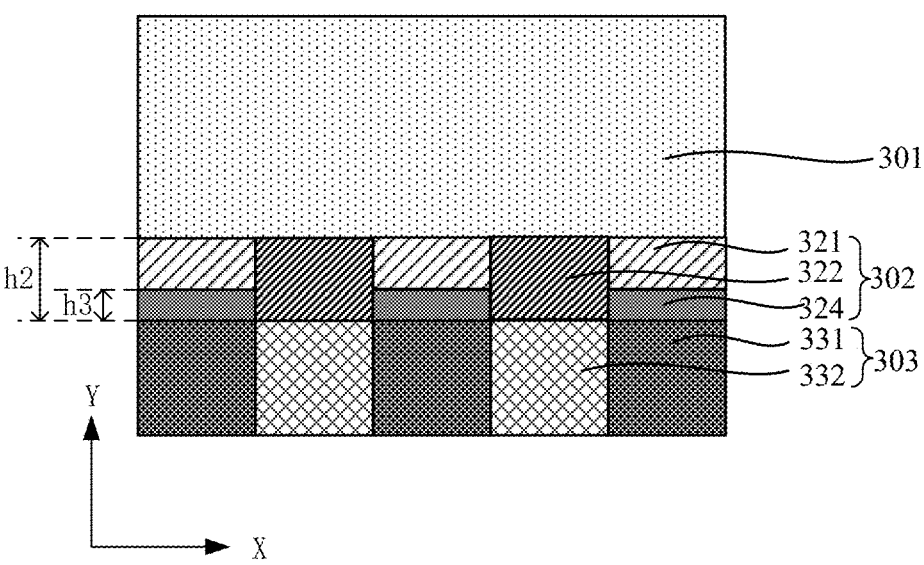
FIG. 7 is a schematic diagram of an overall structure of one more solar cell provided in some embodiments of the present disclosure.

Referring to FIG. 2 and FIG. 7, FIG. 7 is a schematic diagram of an overall structure of one more solar cell, where a direction X represents the first direction, and a direction Y represents a direction perpendicular to a rear surface of a substrate 301. In some embodiments, one respective first region of first regions 321 includes a second portion 324 contacting with a corresponding first doped region 321, and the atomic percentage of the first dopant atoms in the second portion 324 is higher than the atomic percentage of the first dopant atoms in the respective first region 321.

In the solar cell as shown in FIG. 7, the substrate 301, the doped conductive layer 303, first doped regions 331, second doped regions 332 and second regions 322 of the tunneling layer 302 are similar to the substrate 101, the doped conductive layer 103, the first doped regions 131, the second doped regions 132 and the second regions 122 of the tunneling layer 102 as mentioned above, respectively, which will not be described in detail herein.

Referring to the above description and analysis on the first regions 121, one function of the first regions 321 is to provide a passivation effect to the substrate 301, and the other function is to achieve selective transfer of carriers of a specific type to the first doped regions 331 directly opposite to the first regions 321. The passivation effect provided by the first regions 321 to the substrate 301 mainly includes two aspects: on the one hand, the first regions 321 bond with the rear surface of the substrate 301 through escaped hydrogen to passivate the defects on the rear surface of the substrate 301; on the other hand, due to the doping concentration and/or doping types of the first regions 321 and the substrate 301, an electric field is formed on the rear surface of the substrate 301, and the movement trends of carriers with different polarities are adjusted by the electric field, so that on the rear surface of the substrate 301 facing towards the first regions 321, the number of carriers of one polarity is much larger than the number of carriers of the other polarity.

Therefore, in the process of forming the first regions 321, the first regions 321 may be formed to have heavily doped portions, and the heavily doped portions are on a side away from the substrate 301, that is, the first regions 321 include second portions 324 formed on a side of the first regions 321 away from the rear surface of the substrate 301, and the atomic percentage of the first dopant atoms in the second portions 324 is higher than the atomic percentage of the first dopant atoms in the first regions 321. The atomic percentage of the first dopant atoms in the first regions 321 refers to the average atomic percentage of the first dopant atoms in the first regions 321 including the second portions 324. That is to say, the first regions 321 may be regarded as being formed by the second portions 324 and other portions except for the second portions 324, and doping concentration of the doped element in the second portions 324 is higher than doping concentration of the doped element in the other portions except for the second portions 324 of the first regions 321.

After forming the second portion 324 of the first regions 321, the atomic percentage of the first dopant atoms in the second portions 324 is higher than the average atomic percentage of the first dopant atoms in the first regions 321, and a stronger electric field can be formed between the second portions 324 and the substrate 301, thereby improving the field passivation effect provided by the passivation contact structure to the rear surface of the substrate 301. Furthermore, because the percentage of the first dopant atoms in the second portions 324 is higher, when the average percentage of the first dopant atoms in the first regions 321 is fixed, the concentration of the first dopant atoms in the portions of the first regions 321 adjacent to the rear surface of the substrate 301 is relatively low, and hydrogen element can escape from the first regions 321 more easily to passivate the defects on the rear surface of the substrate 301, thereby further reducing the carrier recombination occurred on the rear surface of the substrate 301, and reducing carrier recombination loss of the solar cell.

Figure 8:
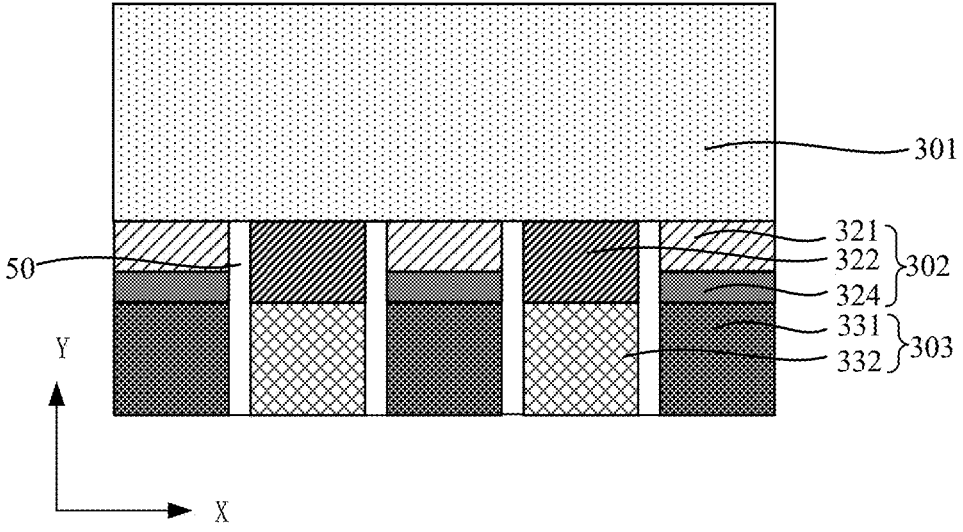
FIG. 8 is a schematic diagram of an overall structure of one more solar cell provided in some embodiments of the present disclosure.

In addition, referring to FIG. 7 and FIG. 8, FIG. 8 is a schematic diagram of an overall structure of a solar cell. The solar cell may further include a plurality of isolation layers 50. In FIG. 8, the plurality of isolation layers 50 are similar to the plurality of isolation layers 50 as mentioned above, and specific materials and specification parameters will not be described in detail here. The plurality of isolation layers 50 can prevent the recombination of holes and electrons from occurring between the first doped regions 331 and the second doped regions 332, thereby prolonging the lifetime of carriers.

In some embodiments, the atomic percentage of the first dopant atoms in the second portions 324 ranges from 2% to 20%.

When the first regions 321 are formed to include the second portions 324, the atomic percentage of the first dopant atoms in the second portions 324 will influence the electric field intensity. When the atomic percentage of the first dopant atoms in the second portions 324 is lower, the formed second portions 324 do not significantly improve the field passivation effect and cannot effectively reduce the carrier recombination occurred on the rear surface of the substrate 301. When the atomic percentage of the first dopant atoms in the second portions 324 is too high, during transfer of carriers to the first doped regions 331, the recombination of electrons and holes in the second portions 324 is too strong, which is prone to lead to a significant increase in overall carrier recombination loss in the first regions 321, and even lead to a significant increase in overall carrier recombination loss of the solar cell.

Therefore, in the process of forming the tunneling layer 302, the atomic percentage of the first dopant atoms in the second portions 324 may be set within a range of 2% to 20%, such as 2.5%, 3%, 4%, 5%, 7.5%, 10%, 13%, 16%, 19%, or the like. By setting the doping concentration of the doped element in the second portions 324 within an appropriate range, the passivation effect provided by the passivation contact structure to the substrate 301 can be significantly enhanced, and the overall carrier recombination loss in the first regions 321 can be effectively controlled. In this way, the carrier recombination loss of the solar cell can be significantly reduced, and the photoelectric conversion efficiency of the solar cell can be improved.

In addition, the tunneling layer 302 includes a plurality of first regions 321, and the atomic percentages of the first dopant atoms in the second portions 324 of the plurality of first regions 321 may be the same or different from each other, which is not specifically limited in the embodiments of the present disclosure.

In some embodiments, in a direction perpendicular to the rear surface of the substrate 301, a ratio of the thickness of a second portion 324 to the thickness of a corresponding first region 321 ranges from 0.25 to 0.5.

In the direction perpendicular to the rear surface of the substrate 301, the thickness of one respective second portion 324 refers to an average distance h3 between two surfaces of the respective second portion 324 opposite to each other in the direction perpendicular to the rear surface of the substrate 301, and the thickness of one respective first region 321 refers to an average distance h2 between two surfaces of the respective first region 321 opposite to each other in the direction perpendicular to the rear surface of the substrate 301.

Referring to the above description and analysis on the second portion 324, on the one hand, the second portions 324 are conducive to enhancing the passivation effect provided by the passivation contact structure to the substrate 301, and on the other hand, the recombination effect of electrons and holes in the second portions 324 is also significantly enhanced, which is prone to influence the overall carrier recombination loss of the first regions 321 and the solar cell.

The carrier recombination loss occurred in the second portions 324 is determined, on the one hand, by the atomic percentage of the first dopant atoms in the second portions 324, and on the other hand, by the movement distances of carriers during transfer of carriers through the second portions 324. When the atomic percentage of the first dopant atoms is fixed, the thicker the second portions 324 are, the larger the carrier recombination loss occurred in the second portions 324. In addition, when the atomic percentage of the first dopant atoms in the first regions 321 is fixed, the thicker the second portions 324 are, the lower the atomic percentage of the first dopant atoms in the second portions 324 per unit thickness, which is prone to lead to a relatively small improvement on the passivation effect provided by the passivation contact structure to the substrate 301.

Therefore, in the process of forming the tunneling layer 302, in the direction perpendicular to the rear surface of the substrate 301, a ratio of the thickness of a second portion 324 to the thickness of a corresponding first region 321 may be set within a range of 0.25 to 0.5, such as 0.275, 0.3, 0.325, 0.375, 0.425, 0.45, or the like. In this way, the second portions 324 can significantly enhance the passivation effect provided by the passivation contact structure to the substrate 301, and the carrier recombination loss occurred in the first regions 321 can be controlled within a relatively small range, thereby significantly reducing the overall carrier recombination loss of the solar cell.

In some embodiments, in the direction perpendicular to the rear surface of the substrate 301, the thickness of one respective second portion 324 ranges from 0.25 nm to 1 nm. Referring to the above description and analysis on the thickness of the second portion 324, in the passivation contact structure, the thickness of a tunneling oxide layer, namely the tunneling layer 302, is usually within a range of 1 nm to 2 nm. Thus, in the process of forming the tunneling layer 302, in the direction perpendicular to the rear surface of the substrate 301, the thickness of one respective second portion 324 may be set within a range of 0.25 nm to 1 nm, such as 0.3 nm, 0.35 nm, 0.5 nm, 0.7 nm, 0.9 nm, or the like.

In some embodiments, the solar cell may further include a first passivation layer and a plurality of electrodes formed on the surface of the doped conductive layer 303 away from the substrate 301, and the plurality of electrodes penetrate through the first passivation layer and are in electrical contact with the doped conductive layer 303. The material of the first passivation layer includes at least one of silicon oxide, aluminum oxide, silicon nitride or silicon oxynitride. The first passivation layer is a single-layer structure or a stacked structure. In the stacked structure, each layer of structure is stacked in the first direction in sequence, the materials of different layers may be different from each other, or the materials of some layers may be the same and different from the materials of other layers. For example, the stacked structure may be a double-layer structure composed of a silicon nitride layer and an aluminum oxide layer which are stacked.

In some embodiments, the solar cell may further include a second passivation layer formed on the front surface of the substrate 301. The material of the second passivation layer includes at least one of silicon oxide, aluminum oxide, silicon nitride or silicon oxynitride. Similarly, the second passivation layer may also be a single-layer structure or a stacked structure, which is not specifically limited in the embodiments of the present disclosure.

In addition, the surface of the first passivation layer away from the substrate 301 may be a smooth surface or a textured surface, that is, the surface of the first passivation layer away from the substrate 301 has a textured microstructure to lengthen an optical path of incident light in the solar cell. The surface of the second passivation layer away from the substrate 301 may also be a smooth surface or a textured surface. When the surface of the second passivation layer away from the substrate 301 has a textured microstructure, the second passivation layer can significantly reduce the light reflection of the incident light by the solar cell, thereby increasing the absorption amount of light by the solar cell, and further improving the photoelectric conversion efficiency of the solar cell.

Figure 9:
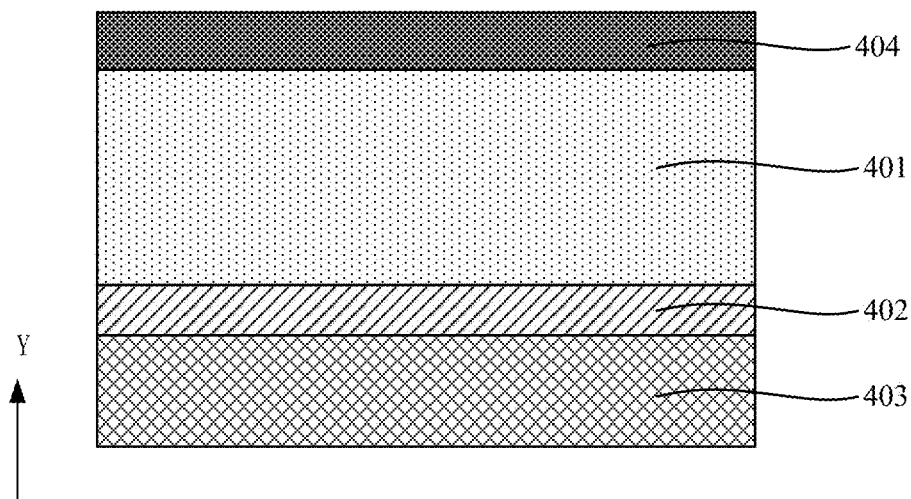
FIG. 9 is a schematic diagram of an overall structure of one more solar cell provided in some embodiments of the present disclosure.

In addition, referring to FIG. 2 and FIG. 9, FIG. 9 is a schematic diagram of an overall structure of a solar cell. The structures of solar cell in the above embodiments of the present disclosure are illustrated based on an IBC solar cell. In some embodiments, the solar cell may also be a TOPCon solar cell. When the solar cell is a TOPCon solar cell, a tunneling layer 402 is formed on a rear surface of a substrate 401, and a doped conductive layer 403 is formed on the tunneling layer 402. One or more emitters 404 are formed on a front surface of the substrate 401. The doping type of the doped conductive layer 403 is the same as the doping type of the substrate 401, and a doping type of the one or more emitters 404 is different from that of the substrate 401. That is to say, the substrate 401 and the doped conductive layer 403 both have first dopant atoms, and the one or more emitters 404 have second dopant atoms. The atomic percentage of the first dopant atoms in the doped conductive layer 403 is higher than the atomic percentage of the first dopant atoms in the substrate 401, and is lower than the atomic percentage of the first dopant atoms in the tunneling layer 402. That is to say, enrichment of the first dopant atoms can be achieved in the tunneling layer 402 formed on the rear surface of the TOPCon solar cell, thereby improving the passivation effect and increasing the open-circuit voltage of the TOPCon solar cell.

In some embodiments, a ratio of the atomic percentage of the first dopant atoms in the tunneling layer 402 to the atomic percentage of the first dopant atoms in the doped conductive layer 403 ranges from 1 to 5, such as 1.1, 1.2, 1.35, 1.5, 1.75, 2, 2.4, 2.8, 3.25, 3.75, 4.5, 4.85, or the like.

In some embodiments, the atomic percentage of the first dopant atoms in the doped conductive layer 403 ranges from 0.2% to 5%, such as 0.25%, 0.5%, 0.8%, 1.2%, 1.5%, 1.8%, 2.25%, 2.75%, 3.5%, 4.5%, or the like.

In some embodiments, the atomic percentage of the first dopant atoms in the doped conductive layer 403 reduces in gradient in a direction perpendicular to the rear surface of the substrate 401 and away from the substrate 401.

In some embodiments, the atomic percentage of the first dopant atoms in the tunneling layer 402 ranges from 1% to 10%, such as 1.25%, 1.5%, 2%, 2.5%, 3.5%, 5%, 6.5%, 8%, 9.5%, or the like.

It should be understood that the substrate 410 in the TOPCon solar cell is similar to the substrate 101 in the IBC solar cell, and thus will not be described here. Moreover, the doped conductive layer 403 in the TOPCon solar cell may be analogous to the first doped regions 131 in the IBC solar cell, the tunneling layer 402 in the TOPCon solar cell may be analogous to the first regions 121 in the IBC solar cell, and the one or more emitters 404 in the TOPCon solar cell may be analogous to the second doped regions 132 in the IBC solar cell.

In addition, the material of the doped conductive layer 403 is similar to the material of the first doped regions 131, the material of the tunneling layer 402 is similar to the material of the first regions 121, and details are not described here. The material of the one or more emitters 404 may be similar to the material of the substrate 401, and may also include at least one of aluminum oxide, silicon oxide and silicon nitride.

Figure 10:
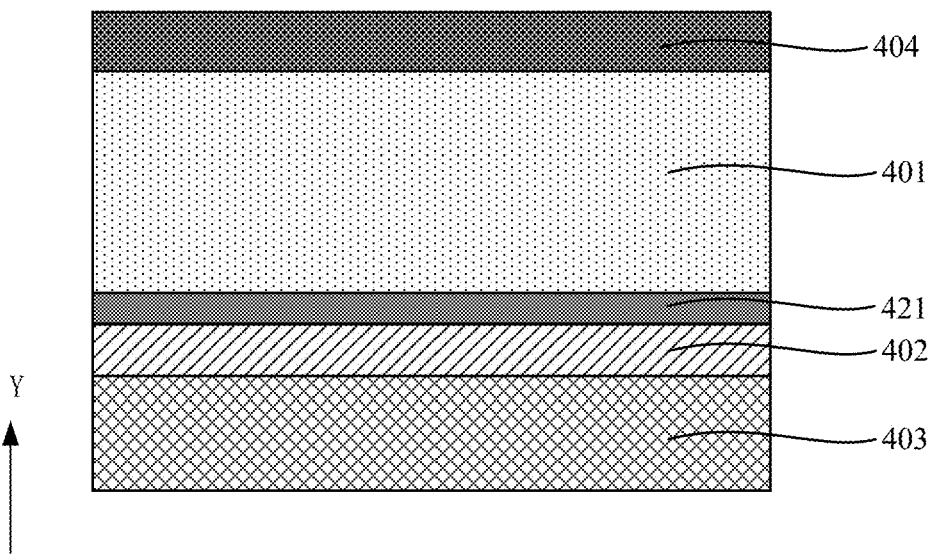
FIG. 10 is a schematic diagram of an overall structure of one more solar cell provided in some embodiments of the present disclosure.

Referring to FIG. 9 and FIG. 10, FIG. 10 is a schematic diagram of an overall structure of one more solar cell, where a direction Y represents a direction perpendicular to the rear surface of the substrate 401. In some embodiments, the tunneling layer 402 includes a first portion 421 contacting with the substrate 401, and the atomic percentage of the first dopant atoms in the first portion 421 is higher than the atomic percentage of the first dopant atoms in the tunneling layer 402, The atomic percentage of the first dopant atoms in the tunneling layer 402 refers to the average atomic percentage of the first dopant atoms in the tunneling layer 402 including the first portion 421. That is to say, the tunneling layer 402 may be regarded as being formed by the first portion 421 and the other portion except for the first portion 421, and the doping concentration of the doped element in the first portion 421 is higher than the doping concentration of the doped element in the other portion except for the first portion 421 of the tunneling layer 402.

In some embodiments, in a direction perpendicular to the rear surface of the substrate 401, a ratio of the thickness of the first portion 421 to the thickness of the tunneling layer 402 ranges from 0.25 to 0.5, such as 0.275, 0.3, 0.325, 0.375, 0.425, 0.45, or the like. The thickness of the first portion 421 in the direction perpendicular to the rear surface of the substrate 401 ranges from 0.25 nm to 1 nm, such as 0.3 nm, 0.35 nm, 0.5 nm, 0.7 nm, 0.9 nm, or the like.

Figure 11:
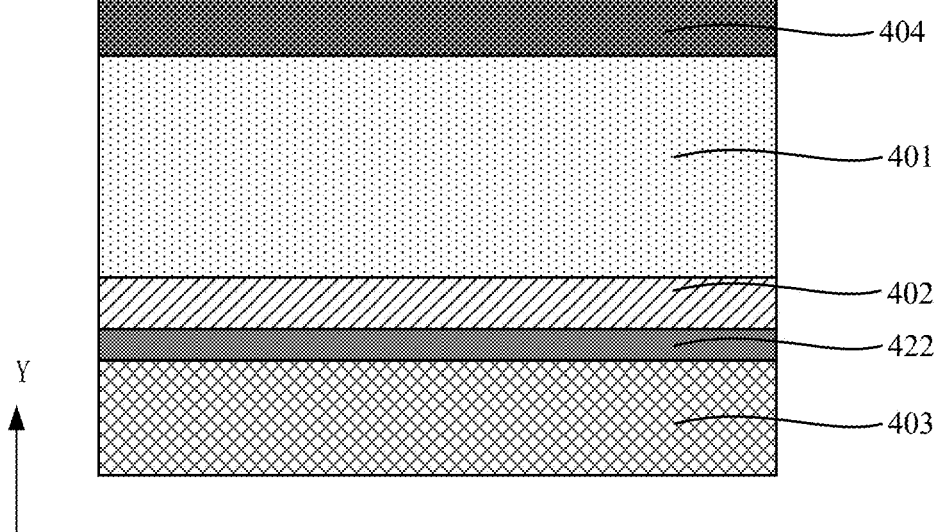
FIG. 11 is a schematic diagram of an overall structure of one more solar cell provided in some embodiments of the present disclosure.

Referring to FIG. 9 and FIG. 11, FIG. 11 is a schematic diagram of an overall structure of one more solar cell, where a direction Y represents the direction perpendicular to the rear surface of the substrate 401. In some embodiments, the tunneling layer 402 includes a second portion 422 contacting with the doped conductive layer 403, and the atomic percentage of the first dopant atoms in the second portion 422 is higher than the atomic percentage of the first dopant atoms in the tunneling layer 402. The atomic percentage of the first dopant atoms in the tunneling layer 402 refers to the average atomic percentage of the first dopant atoms in the tunneling layer 402 including the second portion 422. That is to say, the tunneling layer 402 may be regarded as being formed by the second portion 422 and the other portion except for the second portion 422, and the doping concentration of the doped element in the second portion 422 is higher than the doping concentration of the doped element in the other portion except for the second portion 422 of the tunneling layer 402.

In some embodiments, in the direction perpendicular to the rear surface of the substrate 401, a ratio of the thickness of the second portion 422 to the thickness of the tunneling layer 402 ranges from 0.25 to 0.5, such as 0.275, 0.3, 0.325, 0.375, 0.425, 0.45, or the like. The thickness of the second portion 422 in the direction perpendicular to the rear surface of the substrate 401 ranges from 0.25 nm to 1 nm, such as 0.3 nm, 0.35 nm, 0.5 nm, 0.7 nm, 0.9 nm, or the like.

Figure 12:
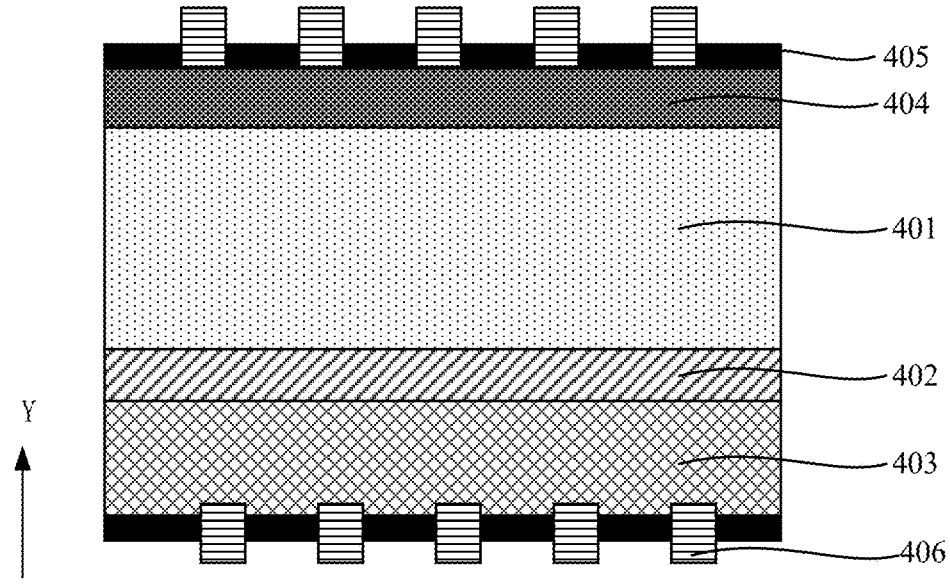
FIG. 12 is a schematic diagram of an overall structure of one more solar cell provided in some embodiments of the present disclosure.

Referring to FIG. 9 and FIG. 12, FIG. 12 is a schematic diagram of an overall structure of one more solar cell, where a direction Y represents the direction perpendicular to the rear surface of the substrate 401. In some embodiments, the solar cell may further include passivation anti-reflection layers 405 and electrodes 406 formed on both the front surface and the rear surface of the substrate 401. The passivation anti-reflection layers 405 cover semiconductor conductive layers formed on the front and rear surfaces of the substrate 401, respectively, and the electrodes 406 penetrate through the passivation anti-reflection layers 405 and are in electrical contact with the semiconductor conductive layers. The semiconductor conductive layers include one or more emitters 404 and a doped conductive layer 403. The structure and material of the passivation anti-reflection layers 405 are similar to those of the first passivation layer as mentioned above, and will not be described in detail here.

It is noted that the features in the above embodiments may not only exist separately in the solar cell, but also can be implemented in combination with each other without technical conflicts and without departing from the inventive concept of the embodiments of the present disclosure. In the present disclosure, some embodiments take the IBC solar cell as examples, and some embodiments take the TOPCon solar cell as examples for description. In the absence of technical conflicts, the features applied to one type of solar cell in the embodiments may also be combined and applied to another type of solar cell, which will not be described in detail in the embodiments of the present disclosure.

In conclusion, some embodiments of the present disclosure provide a solar cell, a passivation contact structure formed by a tunneling layer and a doped conductive layer is disposed on a rear surface of a substrate of the solar cell, which can significantly reduce recombination of carriers occurred on the rear surface of the substrate, thereby reducing the recombination current on the rear surface of the substrate, and reducing the carrier recombination loss of the solar cell. The doped conductive layer is formed by first doped regions and second doped regions having different doping types, in this way, electrodes of the solar cell can be disposed on the rear surface of the solar cell, thereby significantly reducing the influence on the light absorption of the cell caused by disposing electrodes on the front surface of the solar cell, and improving the light absorption of the solar cell. The tunneling layer is formed by first regions and second regions, the first regions interleave with the second regions in a first direction, each first doped region of the first doped regions is formed on a respective first region of the first regions, each first region and each first doped region include first dopant atoms, and the atomic percentage of the first dopant atoms in the first regions is higher than the atomic percentage of the first dopant atoms in the first doped regions. Because of the enrichment of the first dopant atoms in the tunneling layer, the open-circuit voltage of the solar cell can be further increased, thereby reducing the carrier recombination loss, and improving the photoelectric conversion efficiency of the solar cell.

Figure 13:
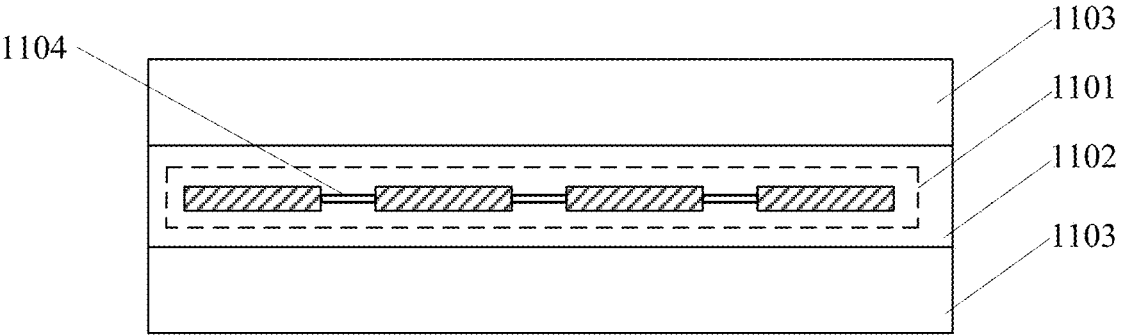
FIG. 13 is a schematic diagram of a structure of a photovoltaic module provided in some embodiments of the present disclosure.

Some embodiments of the present disclosure provide a photovoltaic module. Referring to FIG. 13, the photovoltaic module includes at least one cell string 1101 formed by connecting a plurality of the solar cells as illustrated above, at least one encapsulation layer 1102 configured to cover the surface of the at least one cell string 1101, and at least one cover plate 1103 configured to cover the surface of the at least one encapsulation layer 1102 away from the at least one cell string 1101. The solar cells that are in a single piece or in multiple pieces are electrically connected to form a plurality of cell strings 1101, and the plurality of cell strings 1101 are electrically connected in series and/or in parallel.

In some embodiments, the plurality of cell strings 1101 may be electrically connected by conductive strips 1104. The encapsulation layers 1102 cover front surfaces and rear surfaces of the solar cells. In some embodiments, the encapsulation layers 1102 may be an organic encapsulation adhesive film such as an ethylene-vinyl acetate copolymer (EVA) adhesive film, a polyethylene octene co-elastomer (POE) adhesive film, or a polyethylene terephthalate (PET) adhesive film. In some embodiments, the at least one cover plate 1103 may be a glass cover plate, a plastic cover plate, or the like that has a light transmission function. A surface of the at least one cover plate 1103 facing to the encapsulation layers 1102 may be a textured surface, thereby increasing the utilization rate of incident light.

Although the present disclosure is described above with reference to the preferable embodiments, the embodiments are not intended to limit the present disclosure. Those skilled in the art may make, within the concept of the present disclosure, various possible variations and modifications without departing from the spirit and scope of the present disclosure. Therefore, the protection scope of the present disclosure shall be subjected to the scope defined by the claims of the present disclosure.

What is claimed is:

1. A solar cell, comprising:
a substrate, having a front surface and a rear surface opposite to each other;
a tunneling layer, formed on the rear surface of the substrate; and
a doped conductive layer, formed on the tunneling layer;
wherein the tunneling layer includes first regions and second regions, the first regions interleave with the second regions in a first direction, and the first regions include first dopant atoms;
wherein the doped conductive layer includes first doped regions and second doped regions, each first doped region of the first doped regions is formed on a respective first region of the first regions, and each second doped region of the second doped regions is formed on a respective second region of the second regions; and
wherein the first doped regions have a doping type different from a doping type of the second doped regions, the first doped regions include the first dopant atoms, and an atomic percentage of the first dopant atoms in the first doped regions is lower than an atomic percentage of the first dopant atoms in the first regions.

2. The solar cell according to claim 1, wherein a ratio of the atomic percentage of the first dopant atoms in the first regions to the atomic percentage of the first dopant atoms in the first doped regions ranges from 1 to 5.

3. The solar cell according to claim 2, wherein the atomic percentage of the first dopant atoms in the first regions ranges from 1% to 10%.

4. The solar cell according to claim 2, wherein the atomic percentage of the first dopant atoms in the first doped regions ranges from 0.2% to 5%.

5. The solar cell according to claim 1, wherein in a direction perpendicular to the rear surface of the substrate and away from the substrate, the atomic percentage of the first dopant atoms in the first doped regions reduces in gradient.

6. The solar cell according to claim 1, wherein one respective first region of the first regions includes a first portion contacting with the substrate, and an atomic percentage of the first dopant atoms in the first portion is higher than the atomic percentage of the first dopant atoms in the respective first region.

7. The solar cell according to claim 6, wherein the atomic percentage of the first dopant atoms in the first portion ranges from 2% to 20%.

8. The solar cell according to claim 6, wherein in a direction perpendicular to the rear surface of the substrate, a ratio of a thickness of the first portion to a thickness of the respective first region ranges from 0.25 to 0.5.

9. The solar cell according to claim 1, wherein one respective first region of the first regions includes a second portion contacting with a corresponding first doped region, and an atomic percentage of the first dopant atoms in the second portion is higher than the atomic percentage of the first dopant atoms in the respective first region.

10. The solar cell according to claim 9, wherein the atomic percentage of the first dopant atoms in the second portion ranges from 2% to 20%.

11. The solar cell according to claim 9, wherein in a direction perpendicular to the rear surface of the substrate, a ratio of a thickness of the second portion to a thickness of the respective first portion ranges from 0.25 to 0.5.

12. A photovoltaic module, comprising:
at least one cell string, formed by connecting a plurality of solar cells;
at least one encapsulation layer, configured to cover a surface of the at least one cell string; and
at least one cover plate, configured to cover a surface of the at least one encapsulation layer away from the at least one cell string;
wherein each solar cell of the plurality of solar cells includes:
a substrate, having a front surface and a rear surface opposite to each other;
a tunneling layer, formed on the rear surface of the substrate; and
a doped conductive layer, formed on the tunneling layer;
wherein the tunneling layer includes first regions and second regions, the first regions interleave with the second regions in a first direction, and the first regions include first dopant atoms;
wherein the doped conductive layer includes first doped regions and second doped regions, each first doped region of the first doped regions is formed on a respective first region of the first regions, and each second doped region of the second doped regions is formed on a respective second region of the second regions; and
wherein the first doped regions have a doping type different from a doping type of the second doped regions, the first doped regions include the first dopant atoms, and an atomic percentage of the first dopant atoms in the first doped regions is lower than an atomic percentage of the first dopant atoms in the first regions.

13. The photovoltaic module according to claim 12, wherein a ratio of the atomic percentage of the first dopant atoms in the first regions to the atomic percentage of the first dopant atoms in the first doped regions ranges from 1 to 5.

14. The photovoltaic module according to claim 13, wherein the atomic percentage of the first dopant atoms in the first regions ranges from 1% to 10%.

15. The photovoltaic module according to claim 13, wherein the atomic percentage of the first dopant atoms in the first doped regions ranges from 0.2% to 5%.

16. The photovoltaic module according to claim 12, wherein one respective first region of the first regions includes a first portion contacting with the substrate, and an atomic percentage of the first dopant atoms in the first portion is higher than the atomic percentage of the first dopant atoms in the respective first region.

17. The photovoltaic module according to claim 16, wherein the atomic percentage of the first dopant atoms in the first portion ranges from 2% to 20%.

18. The photovoltaic module according to claim 16, wherein in a direction perpendicular to the rear surface of the substrate, a ratio of a thickness of the first portion to a thickness of the respective first region ranges from 0.25 to 0.5.

19. The photovoltaic module according to claim 12, wherein one respective first region of the first regions includes a second portion contacting with a corresponding first doped region, and an atomic percentage of the first dopant atoms in the second portion is higher than the atomic percentage of the first dopant atoms in the respective first region.

20. The photovoltaic module according to claim 19, wherein in a direction perpendicular to the rear surface of the substrate, a ratio of a thickness of the second portion to a thickness of the respective first portion ranges from 0.25 to 0.5.

\* \* \* \* \*